United States Patent [19]

Khera

[11] Patent Number: 4,723,204

[45] Date of Patent: Feb. 2, 1988

[54] DYNAMIC RAM REFRESH CIRCUIT

[75] Inventor: Muhammad I. Khera, Glendale, Ariz.

[73] Assignee: GTE Automatic Electric Incorporated, Phoenix, Ariz.

[21] Appl. No.: 750,658

[22] Filed: Jul. 1, 1985

Related U.S. Application Data

[63] Continuation-in-part of Ser. No. 707,530, Mar. 4, 1985, abandoned, which is a continuation of Ser. No. 396,179, Jul. 7, 1982, abandoned.

[51] Int. Cl.⁴ .................. G06F 13/00; G11C 13/00
[52] U.S. Cl. .................................. 364/200; 365/222
[58] Field of Search ... 364/200 MS File, 900 MS File; 365/222

[56] References Cited

U.S. PATENT DOCUMENTS

| | | | |
|---|---|---|---|
| 4,028,675 | 6/1977 | Frankenberg | 365/222 X |
| 4,158,883 | 6/1979 | Kadono et al. | 365/222 X |
| 4,185,323 | 1/1980 | Johnson et al. | 365/222 |
| 4,249,247 | 2/1981 | Patel | 364/900 |
| 4,339,808 | 7/1982 | North | 364/900 |
| 4,368,514 | 1/1983 | Persaud et al. | 364/200 |
| 4,575,826 | 3/1986 | Dean | 365/222 |
| 4,621,320 | 11/1986 | Holste et al. | 365/222 X |
| 4,628,482 | 12/1986 | Tachiuchi et al. | 365/222 X |

OTHER PUBLICATIONS

C. E. Boyd et al. "Software/Hardware Approach to Dynamic Memory Refresh," IBM Technical Disclosure Bulletin, vol. 24, No. 10, Mar. 1982.

J. M. Higdon et al. "Refresh Control for Dynamic RAM", IBM Technical Disclosure Bulletin, vol. 24, No. 10, Mar. 1982.

*Primary Examiner*—Gary V. Harkcom
*Assistant Examiner*—David L. Clark
*Attorney, Agent, or Firm*—Frank J. Bogacz; Gregory G. Hendricks

[57] ABSTRACT

A dynamic RAM refresh circuit provides the interface for timely refresh of up to 64K of RAM memory while simultaneously providing for minimal disruption of a CPU's access of that RAM memory. Circuitry is also provided to permit interlock control for timeshared access of the RAM memory on a shared basis with the refresh circuit.

9 Claims, 2 Drawing Figures

DYNAMIC RAM REFRESH CIRCUIT

This is a continuation-in-part of application Ser. No. 707,530, filed Mar. 4, 1985, now abandoned, which is a continuation of application Ser. No. 396,179, filed July 7, 1982, now abandoned.

BACKGROUND OF THE INVENTION

The present invention pertains to microprocessor memory systems and more particularly to a circuit for refreshing dynamic RAM memory on a shared basis.

In memory storage systems of computer systems, dynamic RAM memory is a useful and economical storage medium. One drawback to the use of such RAM memory devices is that the memory must be periodically refreshed in order to maintain the integrity of the data stored within it. To accomplish this end, central processing unit (CPU) access to the memory must be interrupted in order to provide this refreshing function to the RAM memory.

Typical solutions to the refresh problem are as follows. Computer access of the memory is interrupted and a large block of the memory is refreshed. This solution has a shortcoming in that CPU access of the memory during the time of refresh is completely blocked. In an on-line real time system, such memory access blockage of the CPU is intolerable. To overcome this problem, some systems will operate the refreshing circuitry with a clock signal of a very high rate in order to minimize the time during which CPU access of the memory is blocked. While this situation is more tolerable than the previous solution discussed above, the CPU is still delayed in responding to external stimuli during the period of the refresh cycle. In large process control systems such as telephone processing systems, such delay would result in lost telephone calls.

It is the object of the present invention to provide an efficient and economical RAM memory refresh circuit which operates on a shared basis with the CPU in order to be real time efficient.

It is another object of the invention to provide a RAM refresh circuit which will provide interlock control for other external devices to interrupt the CPU's processing.

SUMMARY OF THE INVENTION

A CPU is connected to a bank of dynamic RAM memory. A clock circuit is connected to the CPU and controls the operation of the CPU and memory via periodic pulses supplied over this connection to the CPU. RAM refresh circuitry is connected to the clock, CPU and the RAM memory. The clock circuit is connected to a latch of the refresh circuitry and provides periodic pulses for controlling the refresh operation. This latch is connected to the CPU and generates a hold signal for temporarily interrupting the CPU's processing.

The CPU guarantees that after completion of the present cycle, control will be relinquished to the requesting device. The CPU is further connected to a gating arrangement of the refresh circuit and provides an acknowledge signal to the hold request which was transmitted to the CPU. This gating arrangement is connected to both address counter and a refresh pulse generator which is turn are both connected to the RAM memory.

As a result of the hold signal being acknowledged, the address counter is incremented. Simultaneously, the pulse generator generates the appropriate refresh pulse for refreshing a portion of RAM memory. At the completion of the refresh operation, the circuit, under control of the CPU, reinitializes itself for the next refresh cycle.

A gating arrangement is also provided for permitting interlock control of time shared memory access with other external devices and the CPU.

DESCRIPTION OF THE PREFERRED EMBODIMENT

Figure 1:
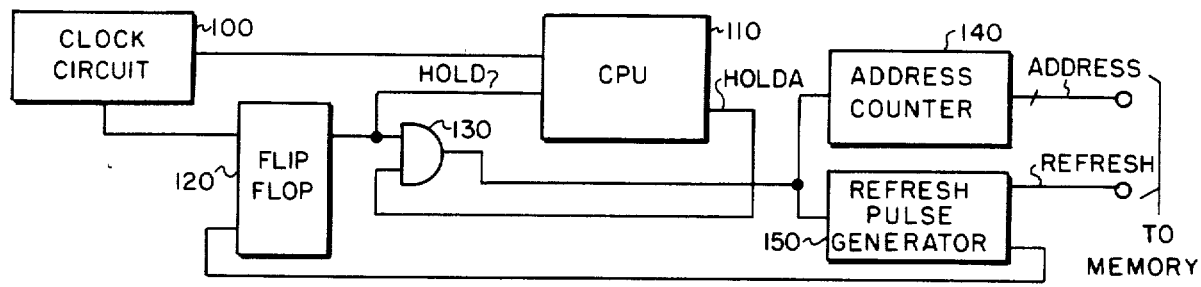
FIG. 1 is a block diagram depicting the interconnection of the refresh circuitry and the central processing unit.

Referring to FIG. 1, CPU 110 is shown connected to clock circuit 100. Clock circuit 100 transmits periodic pulses to CPU 110 in order for CPU 110 to perform its basic operation. Clock circuit 100 is further connected to flip-flop 120 and provides a pulse of 1 microsecond in width every 15 microseconds. Flip-flop 120 is connected to CPU 110 via the HOLD lead, which provides a request to the CPU to stop after completion of its next machine cycle. Flip-flop 120 is further connected to gate 130. CPU 110 is connected to gate 130 via the HOLDA lead, which provides acknowledgement of the HOLD request signal. As a result of the acknowledgement of the HOLD request, gate 130 which is connected to address counter 140 and refresh pulse generator 150, initiates their operation. An appropriate address is transmitted via the address bus to refresh one column of the 64K × 16-bit RAM memory. Refresh pulse generator 150 is further connected to flip-flop 120 and provides the necessary reset at the completion of the cycle, so that CPU 110 may have a time shared access to the memory with the RAM refresh circuitry.

Figure 2:
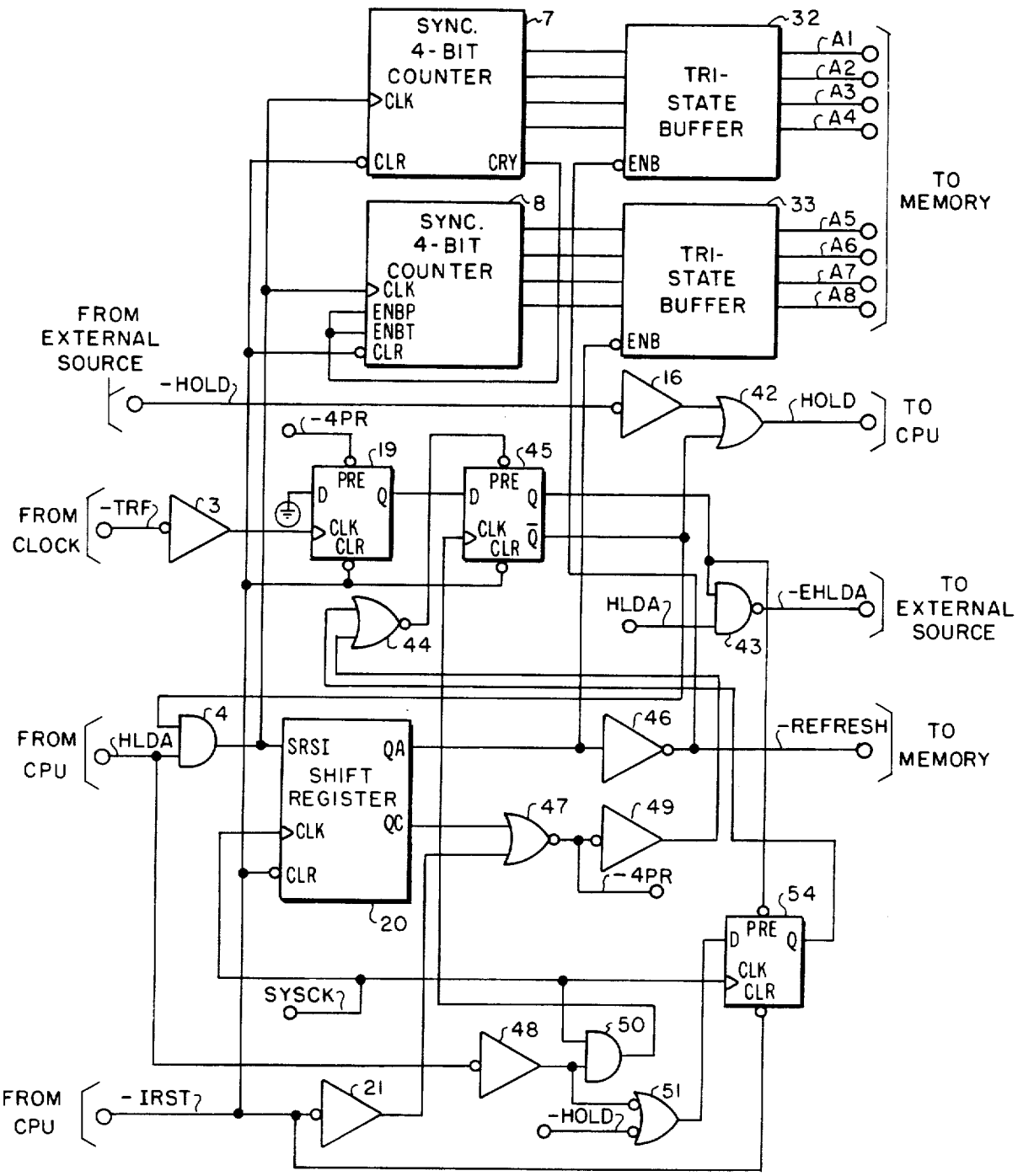
FIG. 2 is a schematic diagram of the RAM refresh circuitry.

Referring to FIG. 2, a 1 microsecond pulse is transmitted from the clock circuit via the -TRF lead, through inverter 3 and clocks flip-flop 19. The Q output of flip-flop 19 is connected to the D input of flip-flop 45 and for transmitting the -TRF signal. Flip-flip 45 would be in the preset condition if some other external device were requesting control of the memory from the CPU. The Q output of flip-flop 45 is connected to gate 42, which transmits a HOLD request to CPU, if flip-flop 45 has not been preset.

The CPU acknowledges the HOLD request signal by means of a HOLD acknowledge signal HLDA. This HLDA signal is transmitted through gate 4 to shift register 20. Gate 4 is connected to counters 7 and 8 and as a result of the HOLD acknowledge signal, the address of the next column to be refreshed is generated. Simultaneously, the HOLD acknowledge signal is transmitted through gate 4 to shift register 20. Shift register 20 produces the refresh signal which is transmitted to the memory via inverter 46. In addition, the refresh signal is transmitted to tri-state buffers 32 and 33, thereby enabling these buffers to transmit the address of the particular memory column to be refreshed.

Shift register 20 is connected to the preset of flip-flops 19 and 45 through NOR-gate 47 inverter 49 and NOR-gate 44. When the QC output of shift register 20 goes HIGH and the CPU supplies the appropriate reset pulse -IRST flip-flops 19, 45 and 54 are preset, allowing access of the memory system by the CPU and other requesting places and initializing the refresh circuit for the next cycle of the -TRF pulse.

For access request to the memory by external devices other than the CPU or refresh circuit, a -HOLD signal is applied by the device to gates 16 and 51. As a result of the -HOLD signal being applied to gate 51, flip-flop 54 presets flip-flop 45 to avoid any refresh request. A HOLD request is generated and transmitted to the CPU via gate 42. When the HOLDA hold acknowledge signal returns from the CPU, it is transmitted to the requesting external device via gate 43.

All inverters and gates may be implemented with standard low power schottky devices. Address counters 7 and 8 may be implemented with synchronous 4-bit binary counters integrated part no. 74LS161; shift register 20 may be implemented with a 4-bit bi-directional universal shift register integrated circuit part no. 74LS194A; tri-state buffers 32 and 33 may be implemented with octal buffers with tristate inputs integrated circuit part no. 74S241. The system's CPU may comprise an Intel 8086 or similar device.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. In a computer system including a CPU, a dynamic RAM memory, a clock circuit operating to generate a periodic refresh request signal of a predetermined frequency and pulse width, and at least one external device for requesting memory access shared with said CPU, said external device and a dynamic RAM memory refresh circuit interconnected to said CPU to allow said CPU to access data stored within said memory, said dynamic RAM memory refresh circuit, said external device and said CPU each connected to said memory for accessing said memory said dynamic RAM memory refresh circuit comprising:

latching means, connected to said clock circuit, for storing said refresh request signal;

said latching, means connected to said CPU, to generate a HOLD request signal for transmission to said CPU, said latching means being operated in response to said refresh request signal;

means for generating, connected to said CPU, to produce a RAM memory refresh signal for transmission to said dynamic RAM memory, said means for generating being operated in response to a HOLD acknowledged signal from said CPU;

means for counting, connected to said means for generating, to store and to increment a next memory address for refreshing;

means for buffering, connected to said means for counting and said memory, to transmit said next memory address for refreshing to said memory;

means for reinitializing connected to said latching means and operated in response to a CPU reset signal and to said RAM memory refresh signal to reset said latching means;

a portion of said memory, being refreshed in response to said RAM memory refresh signal, on an interleaved basis with said CPU access and all portions of said memory being refreshed after a predetermined period of time while said CPU time shares accesses to said memory;

means for interlocking connected between said external device, said memory, said latching means and said CPU, said means for interlocking being operated in response to a memory access request from said external device to generate a HOLD request for transmission to said CPU and to generate a HOLD acknowledge signal for transmission to said external device to allocate time shared access of said memory between said external device, said refresh request and said CPU; and said means for interlocking being further operated in response to time shared access of said memory by said external device and said CPU, to transmit said generated HOLD acknowledge signal to said external device.

2. A dynamic RAM memory refresh circuit as claimed in claim 1, said means for interlocking including:

first gating means, connected to said external device for, receiving said requests for memory access;

first latching means connected to said first gating means and to said external device and said first latching means operated to generate a signal for inhibiting a memory refresh access or operated to transmit said refresh request signal;

second gating means connected between said first latching means and said latching means, said second gating means being operated in response to said signal for inhibiting said refresh access to enable said latching means to grant memory access to said external device; and third gating means connected between said latching means, said CPU and external device, said third gating means being operated in response to said second gating means to transmit a HOLD acknowledge to said requesting external device.

3. A dynamic RAM memory refresh circuit as claimed in claim 2, said latching means including:

a first flip-flop connected to said clock circuit;

a second flip-flop connected to said first flip-flop and operated to inhibit said memory refresh request access to said memory, said second flip-flop being operated in response to said signal for inhibiting of said second gating means for inhibiting refresh access; and OR-gating means connected to said CPU and to said second flip-flop, said OR-gating means being operated to transmit said HOLD request to said CPU.

4. A dynamic RAM memory refresh circuit as claimed in claim 1, wherein said means for counting includes first and second synchronous 4-bit counters, each counter including counter outputs, interconnected so that said first counter has a carry overflow output connected to said second counter, said first and second counter outputs collectively representing said address to be refreshed.

5. A dynamic RAM memory refresh circuit as claimed in claim 4, wherein said means for buffering includes first and second tri-state buffer elements connected respectively to said first and second 4-bit counters and to said memory, each said buffer elements providing up to four parallel address outputs.

6. A dynamic RAM memory refresh circuit as claimed in claim 1, said means for generating including:

fourth gating means connected to said CPU and said fourth gating means being operated to transmit said HOLD acknowledge signal of said CPU;

shift register means connected to said fourth gating means and operated in response to said HOLD acknowledge signal to produce said RAM memory refresh signal for transmission to said memory; and inverter means, connected between said shift register means and said memory, for transmitting said RAM memory refresh signal to said memory.

7. A dynamic RAM memory refresh circuit as claimed in claim 6, wherein said shift register means is further connected to said means for buffering and shift register means being operated in response to said HOLD acknowledge signal to enable said means for buffering.

8. A dynamic RAM memory refresh circuit as claimed in claim 1, said means for reinitialization including:

a first connection to said CPU for receiving a reset signal from said CPU;

a second connection to said first CPU connection, said second connection being operated in response to said CPU reset signal to transmit said reset signal to said counting means;

a third connection to said first CPU connection, said third connection being operated in response to said CPU reset signal to transmit said reset signal to said latching means; and a fourth connection to said first CPU connection, said fourth connection being operated in response to said CPU reset signal to transmit said reset signal to said means for generating.

9. A dynamic RAM memory refresh circuit as claimed in claim 1, said means for reinitialization further including:

a fifth connection to said first CPU for receiving a reset signal from said CPU; and a sixth connection from said first CPU connection to said means for interlocking, said sixth connection operated in response to said CPU reset signal to transmit said reset signal to said means for interlocking.

* * * * *